(12) United States Patent
Kobayashi et al.

(10) Patent No.: US 11,499,993 B2
(45) Date of Patent: Nov. 15, 2022

(54) STAGE AND INSPECTION APPARATUS FOR INSPECTING ELECTRONIC DEVICE

(71) Applicant: Tokyo Electron Limited, Tokyo (JP)

(72) Inventors: Dai Kobayashi, Nirasaki (JP); Hiroyuki Nakayama, Nirasaki (JP); Naoki Akiyama, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 59 days.

(21) Appl. No.: 17/101,735

(22) Filed: Nov. 23, 2020

(65) Prior Publication Data

US 2021/0156891 A1    May 27, 2021

(30) Foreign Application Priority Data

Nov. 25, 2019  (JP) .............................. JP2019-212654

(51) Int. Cl.
*G01R 1/44* (2006.01)
*G01R 1/073* (2006.01)
*G01R 31/28* (2006.01)

(52) U.S. Cl.
CPC ........... *G01R 1/44* (2013.01); *G01R 1/07314* (2013.01); *G01R 31/2831* (2013.01)

(58) Field of Classification Search
CPC ...... G01K 1/026; G01K 13/00; G01K 15/007; G01K 17/06; G01R 31/2874; G01R 31/2877; G01R 31/2875; G01R 1/0491; G01R 31/2863; G01R 1/06711; G01R 31/2887; G01R 31/26; G01R 31/2642; G01R 31/2891; G01R 31/2851; G01R 31/307; G01R 31/308; G01R 31/318511; G01R 31/2637; G01R 1/071; G01R 31/28; G01R 31/2619; G01R 31/2881;
(Continued)

(56) References Cited

U.S. PATENT DOCUMENTS 3,742,174 A * 6/1973 Hamden, Jr. .......... H05B 6/062
                                                        220/573.1
5,715,051 A * 2/1998 Luster ................ G01B 11/0625
                                                         356/237.2
(Continued)

FOREIGN PATENT DOCUMENTS

| JP | 2008-66692 A | 3/2008 |
| JP | 2008-227435 A | 9/2008 |
| JP | 2019-106491 A | 6/2019 |

*Primary Examiner* — Vinh P Nguyen
(74) *Attorney, Agent, or Firm* — Nath, Goldberg & Meyer; Jerald L. Meyer; Tanya E. Harkins

(57) ABSTRACT

A stage on which an inspection object having an electronic device against which a contact terminal of a probe card of an inspection apparatus is pressed by a load applied thereto is placed, includes a first cooling plate including a first coolant flow path formed therein, a heating source mounted on the first cooling plate and including a plurality of light emitting elements so as to heat the inspection object, a transparent member provided on the heating source and transmitting light output from the heating source, a second cooling plate provided on the transparent member so as to hold the inspection object and including a second coolant flow path formed therein, and a transparent resin layer filled between the first cooling plate and the transparent member so as to cover the heating source.

13 Claims, 13 Drawing Sheets

(58) Field of Classification Search
CPC .. G01R 31/2865; G01R 1/07314; G01R 1/44; G01R 31/2856; G01R 31/2886; G01R 31/56; G01R 1/073; H01L 22/00; H05B 45/40; H05B 3/143; H05B 3/0033; H05B 3/20; H05B 45/18; H05B 45/56; H05B 2203/006; G01N 21/8806; G01N 21/9501; G06F 30/39; H03K 19/17764
See application file for complete search history.

(56) References Cited

U.S. PATENT DOCUMENTS

| | | | |
|---|---|---|---|
| 7,227,370 B2* | 6/2007 | Kasukabe | G01R 1/0491 |
| | | | 324/762.05 |
| 9,201,093 B2* | 12/2015 | Lee | G01R 1/0441 |
| 11,221,358 B2* | 1/2022 | Kasai | G01R 31/2874 |
| 2015/0075748 A1* | 3/2015 | Suzuki | H01L 21/67103 |
| | | | 165/80.5 |
| 2016/0379853 A1 | 12/2016 | Smaller et al. | |
| 2016/0379854 A1 | 12/2016 | Vopat et al. | |
| 2021/0156890 A1* | 5/2021 | Kobayashi | G01R 1/0408 |

* cited by examiner

STAGE AND INSPECTION APPARATUS FOR INSPECTING ELECTRONIC DEVICE

CROSS-REFERENCE TO RELATED APPLICATION

This application is based upon and claims the benefit of priority from Japanese Patent Application No. 2019-212654, filed on Nov. 25, 2019, the entire contents of which are incorporated herein by reference.

TECHNICAL FIELD

The present disclosure relates to a stage and an inspection apparatus.

BACKGROUND

Patent Document 1 discloses a technique including a heating source having a plurality of light emitting elements that emit light to a wafer in a processing chamber, a light transmitting member that transmits the light of the light emitting elements, a cooling member that is in direct contact with the heating source, and a cooling member for controlling the cooling mechanism.

PRIOR ART DOCUMENT

Patent Document

Patent Document 1: Japanese Laid-Open Patent Publication No. 2008-227435

SUMMARY

According to embodiments of the present disclosure, there is provided a stage on which an inspection object having an electronic device against which a contact terminal of a probe card of an inspection apparatus is pressed by a load applied thereto is placed, including a first cooling plate including a first coolant flow path formed therein, a heating source mounted on the first cooling plate and including a plurality of light emitting elements so as to heat the inspection object, a transparent member provided on the heating source and transmitting light output from the heating source, a second cooling plate provided on the transparent member so as to hold the inspection object and including a second coolant flow path formed therein, and a transparent resin layer filled between the first cooling plate and the transparent member so as to cover the heating source.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
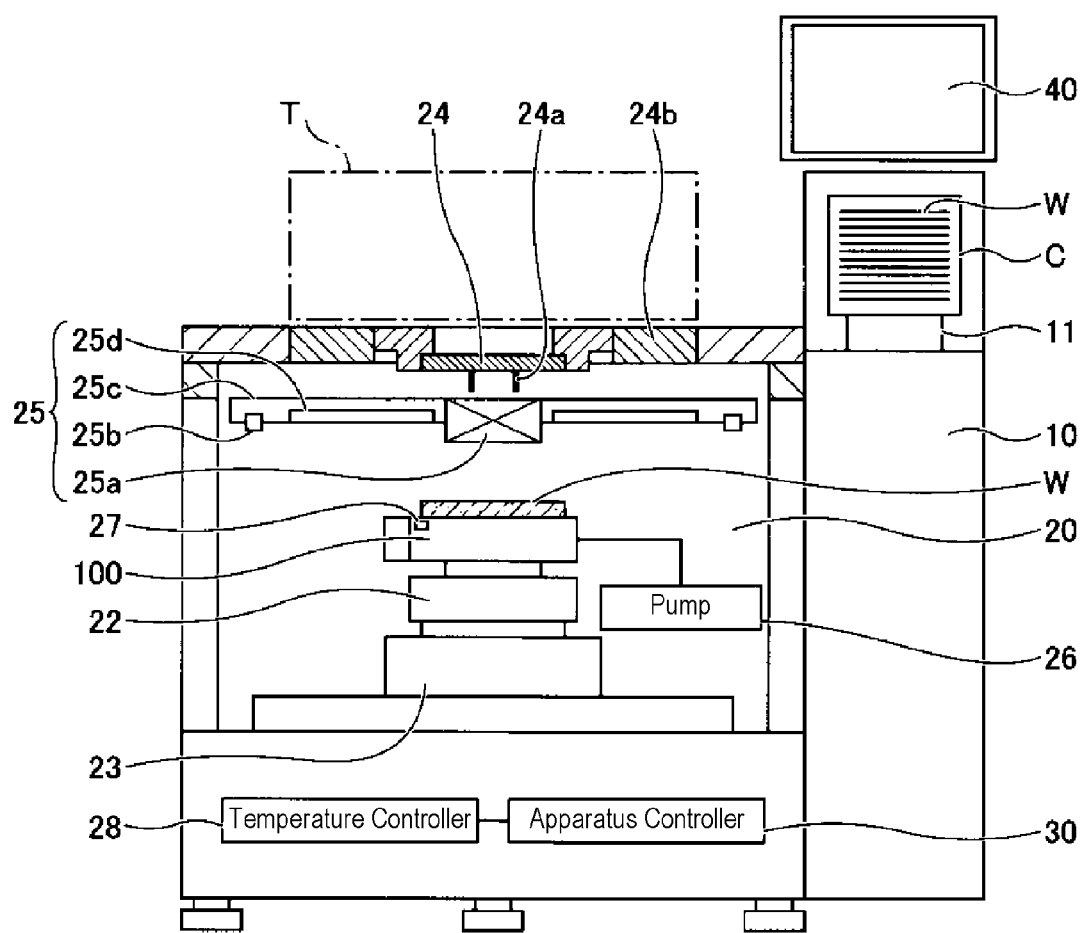
FIG. 1 is a view illustrating an exemplary configuration of an inspection apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, exemplary embodiments for carrying out the present disclosure will be described with reference to drawings. In the specification and drawings, constituent elements that are substantially the same will be denoted by the same reference numerals, and redundant descriptions may be omitted. The following description will be made using a vertical direction or a vertical relationship in the drawings, but it does not represent a universal vertical direction or relationship.

First Embodiment

Figure 2:
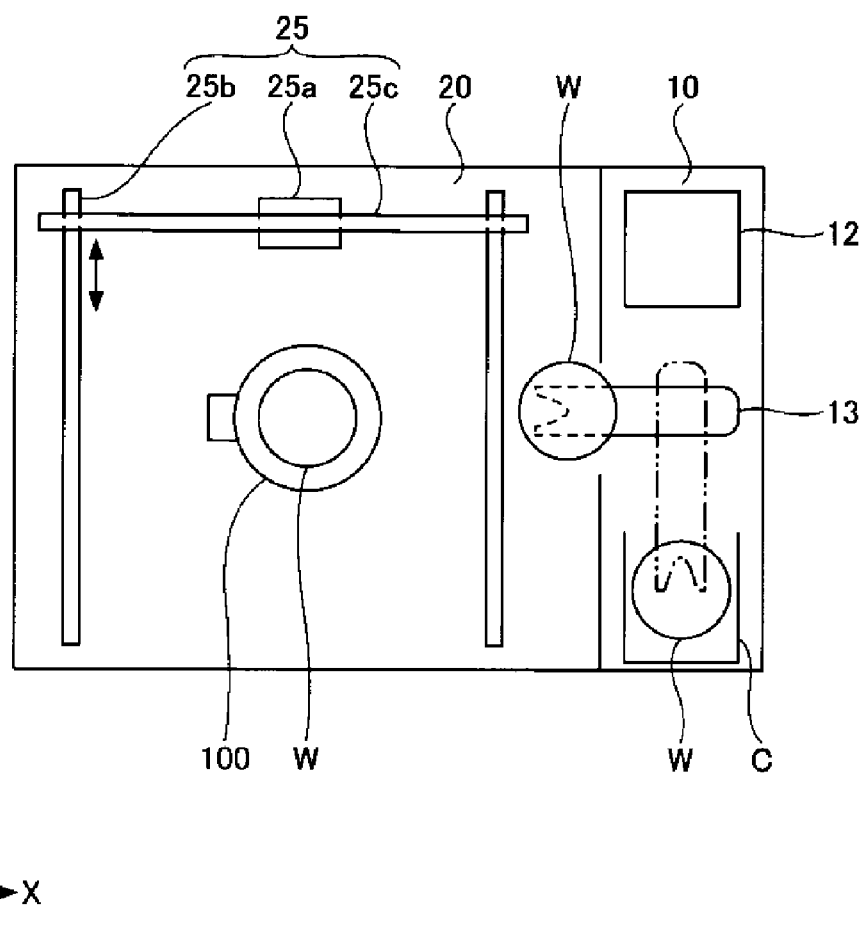
FIG. 2 is a plan view of the inspection apparatus of FIG. 1.
Figure 3:
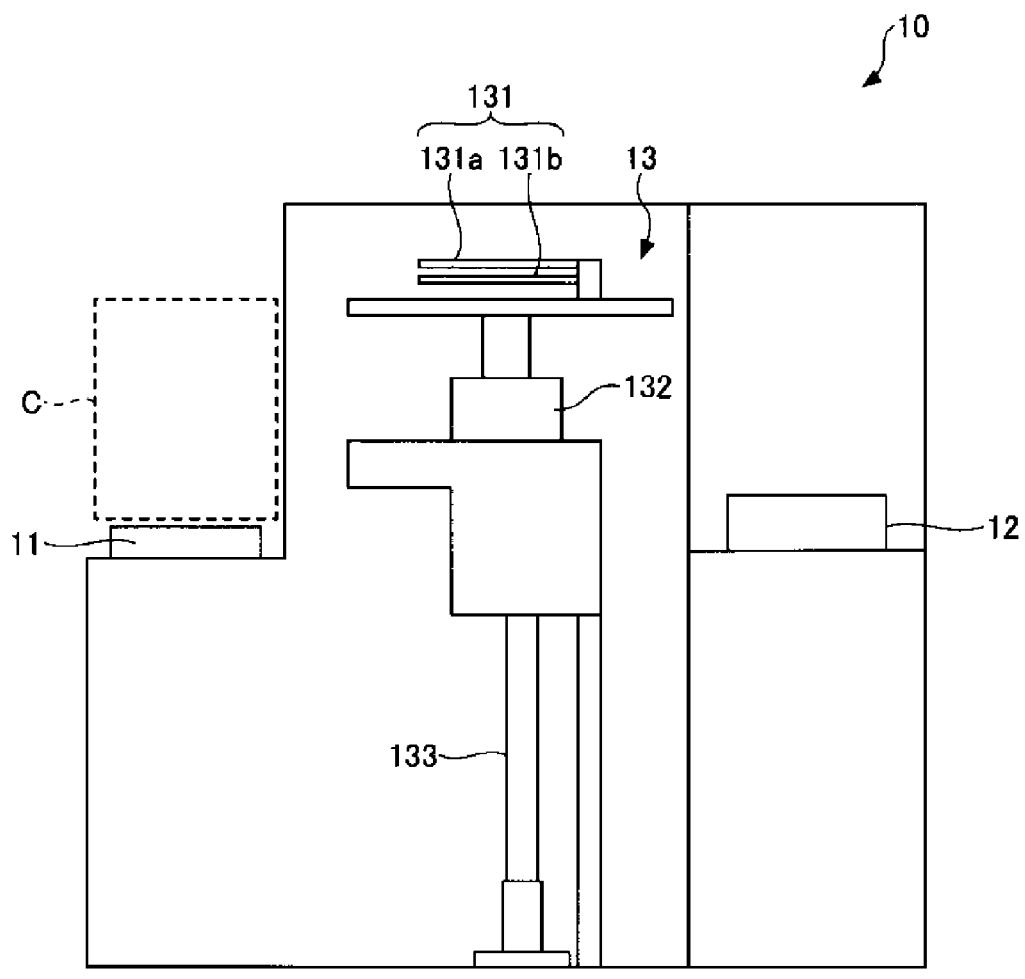
FIG. 3 is a view illustrating an exemplary configuration of a wafer transport mechanism of the inspection apparatus of FIG. 1.

With reference to FIGS. 1 to 3, an inspection apparatus 1 will be described. FIG. 1 is a view illustrating an exemplary configuration of the inspection apparatus 1. FIG. 2 is a plan view of the inspection apparatus 1 of FIG. 1. FIG. 3 is a view illustrating an exemplary configuration of a wafer transport mechanism of the inspection apparatus 1 of FIG. 1.

The inspection apparatus 1 includes a loader part 10, an inspection part 20, and an apparatus controller 30. The inspection apparatus 1 transports a semiconductor wafer (hereinafter, referred to as "wafer W"), which is an inspection object, from the loader part 10 to the inspection part 20 under the control of the apparatus controller 30, and applies an electrical signal to an electronic device formed on the semiconductor wafer so as to inspect various electrical properties. In such an inspection, the electronic device formed on the wafer W is a device under test (DUT).

The loader part 10 includes a load port 11, an aligner 12, and a wafer transport mechanism 13.

A cassette C containing wafers W is placed in the load port 11. The cassette C is, for example, a front opening unified pod (FOUP).

The aligner 12 aligns the wafer W with reference to a cutout such as an orientation flat or a notch formed on the wafer W.

The wafer transport mechanism 13 transports the wafer W among the cassette C placed in the load port 11, the aligner 12, and a stage 100 provided in the inspection part 20 described later. The wafer transport mechanism 13 has an arm unit 131, a rotational driving mechanism 132, and a vertical driving mechanism 133.

The arm unit 131 includes arms 131a and 131b that are provided in two stages in the vertical direction and are independently movable in the horizontal direction. Each of the arms 131a and 131b holds a wafer W.

The rotational driving mechanism 132 is provided below the arm unit 131, and rotationally drives the arm unit 131. The rotational driving mechanism 132 includes, for example, a stepping motor.

The vertical driving mechanism 133 is provided below the rotational driving mechanism 132, and vertically drives the arm unit 131 and the rotational driving mechanism 132. The vertical driving mechanism 133 includes, for example, a stepping motor. The wafer transport mechanism 13 is not limited to the configuration illustrated in FIG. 3, and may have, for example, an articulated arm and a vertical driving mechanism.

In the loader part 10, first, the wafer transport mechanism 13 transports the wafer W accommodated in the cassette C to the aligner 12. Then, the aligner 12 aligns the wafer W. Then, the wafer transport mechanism 13 transports the aligned wafer W from the aligner 12 to the stage 100 provided in the inspection part 20.

The inspection part 20 is arranged adjacent to the loader part 10. The inspection part 20 includes the stage 100, a lifting mechanism 22, an XY stage 23, a probe card 24, an alignment mechanism 25, a pump 26, a temperature sensor 27, and a temperature controller 28.

The wafer W is placed on a top surface of the stage 100. The stage 100 includes, for example, a vacuum chuck or an electrostatic chuck. The stage 100 has a coolant flow path, and a coolant such as water or Galden (registered trademark) is supplied from the pump 26 to the coolant flow path. As a result, the stage 100 is cooled.

The lifting mechanism 22 is provided below the stage 100, and moves the stage 100 up and down with respect to the XY stage 23. The lifting mechanism 22 includes, for example, a stepping motor.

The XY stage 23 is provided below the lifting mechanism 22, and moves the stage 100 and the lifting mechanism 22 in two axial directions (X direction and Y direction in the drawings). The XY stage 23 is fixed to the bottom of the inspection part 20. The XY stage 23 includes, for example, a stepping motor.

The probe card 24 is arranged above the stage 100. A plurality of probes 24a is disposed on the probe card 24 near the stage 100. The probe card 24 is detachably attached to the head plate 24b. A tester (not illustrated) is connected to the probe card 24 via a test head T.

The alignment mechanism 25 includes a camera 25a, a guide rail 25b, an alignment bridge 25c, and a light source 25d. The camera 25a is attached to the center of the alignment bridge 25c to face downward, and captures an image of, for example, the stage 100 and the wafer W. The camera 25a is, for example, a CCD camera or a CMOS camera. The guide rail 25b supports the alignment bridge 25c so as to be movable in the horizontal direction (Y direction in the drawing). The alignment bridge 25c is supported by a pair of left and right guide rails 25b, and moves in the horizontal direction (Y direction in the drawing) along the guide rails 25b. As a result, the camera 25a moves between a standby position and a position directly below the center of the probe card 24 (hereinafter, referred to as a "probe center") via the alignment bridge 25c. During alignment, the camera 25a located at the probe center captures an image of electrode pads of the wafer W on the stage 100 from above while the stage 100 moves in the XY directions, and performs image processing so as to display the captured image on the display device 40. The light source 25d is provided below the alignment bridge 25c and emits light to the stage 100. The light source 25d is, for example, an LED light source in which a large number of light emitting diodes (LEDs) are arranged, and emits light when the image of the wafer W is captured by the camera 25a. The light source 25d is used as illumination during image capturing.

The alignment mechanism 25 moves the camera 25a to the standby position when the alignment of the wafer W in the XY directions is completed. When the camera 25a is located at the standby position, the camera 25a is not directly below the probe card 24 and is offset in the Y direction. When the lifting mechanism 22 raises the stage 100 with respect to the XY stage 23 in this state, the plurality of probes 24a come into contact with the electrode pads of the wafer W on the stage 100, so as to be in a state in which an inspection of electrical characteristics of the electronic devices on the wafer W can be performed. The probes 24a are an example of contact terminals.

The pump 26 is, for example, a mechanical pump that sends the coolant under pressure. The coolant output from the pump 26 is circulated between the coolant flow path in the stage 100 and the pump 26. The coolant is, for example, water or Galden (registered trademark), which is a colorless liquid capable of transmitting light.

The temperature sensor 27 detects a temperature of the stage 100. The temperature sensor 27 is, for example, a thermocouple embedded in the stage 100.

The temperature controller 28 is provided below the stage 100. The temperature controller 28 is, for example, a computer. The temperature controller 28 executes a temperature control method including a step of detecting the temperature of the stage 100 by the temperature sensor 27, and a step of performing lighting control of an LED module of the stage 100 and driving control of the pump 26 based on the temperature of the stage detected by the temperature sensor 27.

When inspecting the electrical characteristics of the electronic devices on the wafer W, the wafer W is pressed upward by the lifting mechanism 22 in order to ensure electrical contact between the probes 24a and the electrode pads of the wafer W. That is, the probes 24a are pressed against the electrode pads on the wafer W by applying a load. In this case, a load of about 1 g to about 5 g may be applied to each probe 24a.

For example, if a load of about 1 g to about 5 g is applied to each probe 24a when inspecting one electronic device of a 30 mm square (30 mm long×30 mm wide in a plan view) included in the wafer W, a load of about 100 kg to several hundreds of kg or more may be applied to the wafer W when the number of electrode pads is large.

For this reason, the stage 100 is required to have a strength capable of withstanding the above-described load, and is required to have a configuration that falls within a range in which the inspection of the electrical characteristics is not hindered (a permissible range of displacement due to deformation) even if the stage 100 deformed.

During the inspection of the electrical characteristics, the heat generation amount of one electronic device (DUT) may become about 100 W to several hundreds of W or more. Therefore, the stage 100 is required to have a cooling (heat-absorbing) structure and a heating structure for adjusting the temperature of the electronic devices within a predetermined temperature range (e.g., within ±3 degrees C.) with respect to a set temperature in the inspection. In order to keep an electronic device having a large heat generation amount within a predetermined temperature range with respect to a set temperature, it is necessary to perform heat absorption and heating at high speed.

Details of the stage 100 that meets these requirements will be described below.

Figure 4:
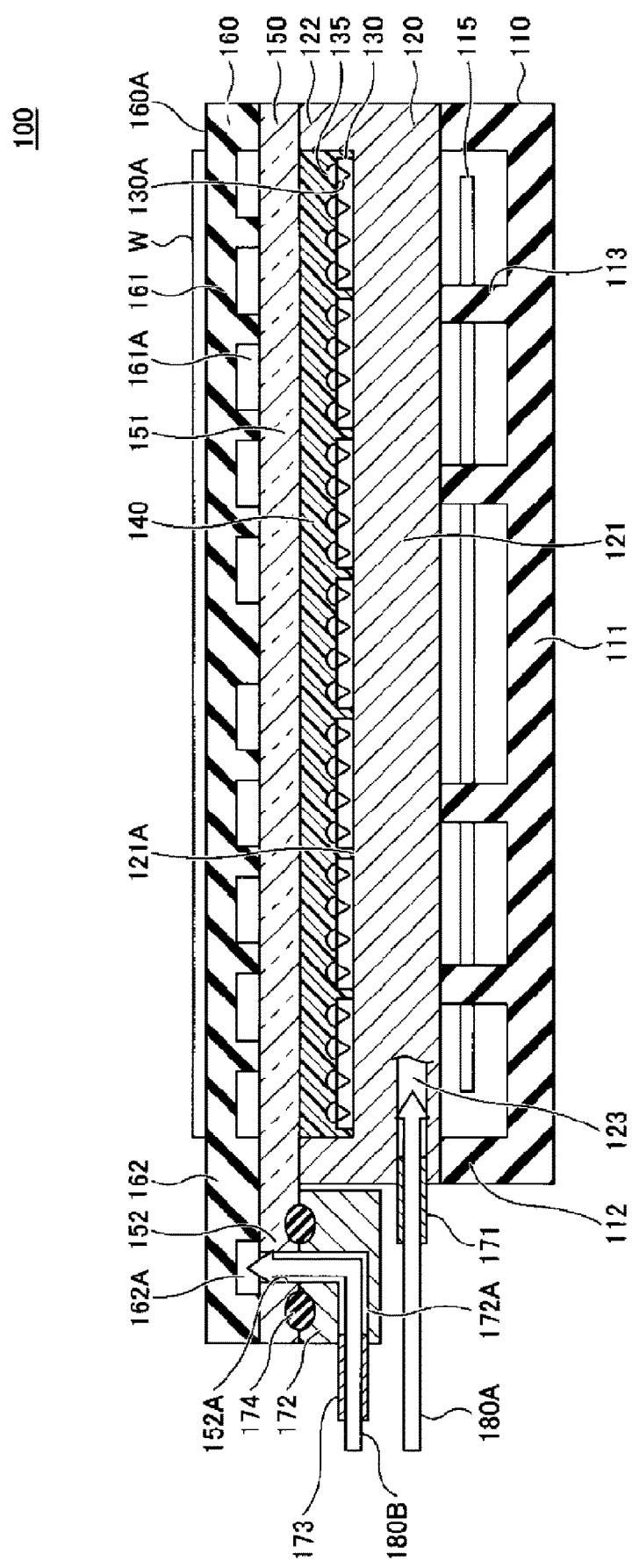
FIG. 4 is a cross-sectional view illustrating an exemplary configuration of a stage according to a first embodiment.

FIG. 4 is a cross-sectional view illustrating an exemplary configuration of the stage 100 of a first embodiment. The stage 100 includes a base plate 110, a control board 115, a middle plate 120, an LED module 130, a transparent resin layer 140, a glass plate 150, a top plate 160, a pipe 171, a connecting portion 172, a pipe 173, and an O-ring 174.

Hereinafter, a description will be made with reference to a vertical direction in the drawing. Further, the term "in a plan view" means "viewed from above to below in a plane."

The base plate 110 is a member serving as a base (base stage) of the stage 100 and having a circular shape in a plan view, and is made of, for example, ceramic such as alumina ($Al_2O_3$). The base plate 110 has a disk-shaped base portion 111, an outer peripheral wall 112 protruding upward along the outer periphery thereof, and a holding portion 113 protruding from the top surface of the base portion 111.

The upper end of the outer peripheral wall 112 is fixed to the bottom surface of the middle plate 120, and the holding portion 113 holds the control board 115 and the middle plate 120. In a state in which the middle plate 120 is fixed to the base plate 110, the space surrounded by the base portion 111, the outer peripheral wall 112, and the middle plate 120 is closed. The control board 115 is arranged in this space.

The control board 115 is a wiring board on which, for example, a microcomputer (not illustrated) that performs, for example, lighting control of the LED module 130, is mounted. The control board 115 is connected to the temperature controller 28 (see FIG. 1) via, for example, a wire (not illustrated).

The middle plate 120 is a member arranged on the base plate 110 and having a circular shape in a plan view, and is made of, for example, copper (Cu). As an example, the middle plate 120 is fixed on the base plate 110 by, for example, screwing. The middle plate 120 is an example of a first cooling plate.

The middle plate 120 has a disk-shaped base portion 121, an outer peripheral wall 122 protruding upward along its outer periphery, and a coolant flow path 123. The coolant flow path 123 is an example of a first coolant flow path. The middle plate 120 is provided with a through hole (not illustrated), through which a wire connecting the control board 115 and the LED module 130 to each other passes. The through hole penetrates the middle plate 120 so as to connect a top surface and a bottom surface of the middle plate 120.

A plurality of LED modules 130 is mounted on a top surface of the base portion 121. In addition, an upper end of the outer peripheral wall 122 is fixed to the glass plate 150 using, for example, an adhesive.

The space above the base portion 121 is a mounting portion of the LED module 130. Since the height of the outer peripheral wall 122 from the base portion 121 is higher than the height of the LED module 130, the LED module 130 mounted on the base portion 121 and the glass plate 150 are separated from each other in the height direction. The space between the LED module 130 and the glass plate 150 is filled with the transparent resin layer 140.

Although FIG. 4 illustrates only a portion of the coolant flow path 123, in order to cool the LED module 130, the coolant flow path 123 is actually provided inside the base portion 121 so as to cover substantially the entire base portion 121 in a plan view. A coolant 180A is supplied to the coolant flow path 123 via a pipe 171 as indicated by an arrow. As the coolant 180A, for example, water or Galden (registered trademark) may be used, and the coolant may be supplied to the coolant flow path by the pump 26 (see FIG. 1).

Each LED module 130 has a plurality of LEDs 130A and a lens 135 attached to each LED 130A. The LED module 130 is an example of a heating source, and the LED 130A is an example of a light emitting element. As the LED 130A, an LED that outputs near infrared light may be used. The lens 135 is attached to the light output portion of each LED 130A. The lens 135 is provided for adjusting the directivity of the light output from the LED 130A so as to suppress the dispersion of the light, thereby narrowing an emitting range.

The LED module 130 is provided to heat the wafer W placed on the top plate 160 in order to adjust the temperature of the wafer W. The light (near infrared light) output from each LED 130A of the LED module 130 is absorbed by the top plate 160 through the transparent resin layer 140 and the glass plate 150, and heats the top plate 160. As a result, the wafer W placed on the placement surface 160A of the top plate 160 can be heated.

The lens 135 is made of, for example, glass or resin. A refractive index of the lens 135 is set to be equal to a refractive index of the transparent resin layer 140, and improves light extraction efficiency from the lens 135 to the transparent resin layer 140.

Since the transparent resin layer 140 fills the space surrounded by the base portion 121 of the middle plate 120, the LED modules 130, the outer peripheral wall 122, and the glass plate 150, the space between all the LED modules 130 and the glass plate 150 is sealed. Therefore, the transparent resin layer 140 is a disk-shaped transparent resin member having a circular shape in a plan view. The transparent resin layer 140 is an example of a transparent resin.

The stage 100 is required to have a strength capable of withstanding a load during the inspection of electrical characteristics. Therefore, the space between the LED module 130 and the glass plate 150 is sealed with the transparent resin layer 140 to hold and support the entire glass plate 150, thereby reinforcing the glass plate 150 and the top plate 160. This realizes a configuration in which the glass plate 150 and the top plate 160 are unlikely to be displaced even if a load is applied during the inspection of electrical characteristics. The displacement of the glass plate 150 and the top plate 160 due to a load is the displacement of the stage 100 due to a load.

The transparent resin layer 140 is provided in order to suppress the displacement of the stage 100, particularly the displacement of the glass plate 150 and the top plate 160 when the probes 24a are pressed against the electrode pads on the wafer W by applying a load during the inspection of the electrical characteristics of the electronic devices on the wafer W.

With such a configuration, the stage 100 having a strength that can withstand a load during the inspection of electrical characteristics of the electronic devices on a wafer W is realized. This is because the glass plate 150 and the top plate 160 are reinforced with the transparent resin layer 140 to suppress the displacement thereof and to stably perform the inspection of electrical characteristics.

In addition, the transparent resin layer 140 is made of a transparent resin material in order to efficiently guide the light output from the LED module 130 to the glass plate 150. This is to efficiently heat the top plate 160 by the light emission of the LED module 130. As the resin material of the transparent resin layer 140, for example, a silicon-based or epoxy-based transparent resin may be used.

As the transparent resin material of the transparent resin layer 140, a transparent resin material having a high transmittance at a wavelength of the light emitted from the LED 130A is preferable. This is because, by improving the light transmittance of the transparent resin layer 140, it is possible to further reduce light attenuation in the transparent resin layer 140, and thus to more efficiently guide the light to the glass plate 150.

Preferably, the resin material of the transparent resin layer 140 has a high hardness in a cured state. This is to obtain a structure that more easily suppresses the displacement of the glass plate 150 and the top plate 160 due to a load.

The resin material of the transparent resin layer 140 is filled in the space surrounded by the base portion 121, the LED module 130, the outer peripheral wall 122, and the glass plate 150 in the state in which the LED module 130 is mounted on the base portion 121 of the middle plate 120. Further, if the glass plate 150 is fixed to the upper end of the outer peripheral wall 122 before the resin material is cured, the transparent resin layer 140, which is in close contact with the bottom surface of the glass plate 150, is obtained.

The glass plate 150, which is an example of a transparent member, is provided on the outer peripheral wall 122 of the middle plate 120 and the transparent resin layer 140, and is fixed to the upper end of the outer peripheral wall 122 by, for example, an adhesive. The glass plate 150 has a disk-shaped base portion 151 and a protrusion 152 protruding from the base portion 151 in a plan view. The top plate 160 is arranged on the glass plate 150. The glass plate 150 and the top plate 160 are bonded to each other.

When the top plate 160 is placed on the glass plate 150, the base portion 151 covers grooves 161A provided on the bottom of the top plate 160 from below, and the protrusion 152 covers the groove 162A provided on the bottom of the top plate 160 from below. As a result, the grooves 161A and 162A serve as a coolant flow path.

A connecting portion 172 is fixed to a bottom surface of the protrusion 152 via a rubber O-ring 174 by, for example, screwing. The protrusion 152 has a through hole 152A that communicates with the coolant flow path 172A in the connecting portion 172. The through hole 152A communicates with the groove 162A in the top plate 160.

The glass plate 150 is transparent in order to efficiently guide the light output from the LED module 130 to the top plate 160. As the glass plate 150, heat-resistant glass may be used such that it can withstand the heat generated by the wafer W and the heat generated by the near-infrared light of the LED module 130. For example, TEMPAX Float (registered trademark) may be used.

In the stage 100 according to the first embodiment, the base portion 121 of the middle plate 120 and the transparent resin layer 140 filling the space between the LED module 130 and the glass plate 150 support the glass plate 150 and the top plate 160 when a load is applied during the inspection of electrical characteristics, thereby suppressing the displacement of the glass plate 150 and the top plate 160. Therefore, it is possible to reduce a thickness of the glass plate 150 compared to the case where the transparent resin layer 140 does not exist.

By reducing the thickness of the glass plate 150, it is possible to improve the light transmittance of the glass plate 150 by about several percent, and thus the light can be guided more efficiently to the top plate 160. Further, by reducing the thickness of the glass plate 150, diffusion of the light output from the LED module 130 is reduced, and thus it is possible to more efficiently guide the light to a desired portion of the top plate 160, thereby allowing more efficient heating of the electronic devices to be inspected.

In the first embodiment, a mode in which the glass plate 150 is used as an example of the transparent member has been described, but a transparent resin plate may be used instead of the glass plate 150. As the transparent resin plate, for example, an acrylic or polycarbonate resin plate may be used.

The top plate 160 has the same shape as the glass plate 150 in a plan view, and has a placement surface 160A, a disk-shaped base portion 161, and a protrusion 162 protruding from the base portion 161 in a plan view. The top plate 160 is an example of a second cooling plate. As the top plate 160, for example, a silicon carbide (SiC) plate may be used. The top plate 160 includes a vacuum chuck or an electrostatic chuck (not illustrated).

The top plate 160 has a groove 161A on the bottom of the base portion 161, and has a groove 162A on the bottom of the protrusion 162. The grooves 161A and 162A are formed so as to be recessed upward from the bottom surfaces of the base portion 161 and the protrusion 162. The grooves 161A and 162A are covered with the glass plate 150 from the bottom so as to serve as a coolant flow path. The grooves 161A and 162A are an example of a second coolant flow path.

The groove 161A is formed in a predetermined pattern (e.g., a spiral pattern) in the entire base portion 161 in a plan view, and a plurality of grooves 161A shown in a cross section of FIG. 4 all communicate with each other and communicate with the groove 162A provided in the protrusion 162.

Therefore, the coolant 180B flows into the groove 162A from the pipe 173 through the coolant flow path 172A in the connecting portion 172 and the through hole 152A in the glass plate 150, flows into the grooves 161A from the groove 162A, as indicated by an arrow, and is discharged to the outside of the stage 100 through a discharge groove (not illustrated) similar to the groove 162A.

As the coolant 180B, for example, water or Galden (registered trademark), which is a colorless liquid capable of transmitting light, is used, and is supplied to the coolant flow path by a pump (not illustrated) provided outside the inspection apparatus 1 (see FIGS. 1 to 3).

Since a bottom surface of the coolant flow path implemented by the grooves 161A and 162A is the glass plate 150, the coolant 180B passes through an optical path of the light output from the LED module 130. Therefore, a transparent coolant is preferable as the coolant 180A. This is to reduce the attenuation of light caused by the coolant 180A such that more light that is output from the LED module 130 reaches the top plate 160, thereby improving the heating efficiency.

In the inspection apparatus 1 including such a stage 100, for example, when one of a plurality of electronic devices formed on the wafer W is selected as an inspection object so as to inspect electrical characteristics, the inspection may be performed as follows. In a state in which the wafer W is suctioned to the placement surface 160A by a vacuum chuck, the wafer W is moved upward by the lifting mechanism 22, and a load is applied to the electrode pads on the wafer W to press the probes 24a. Next, the LED module 130, which is located just below the electronic device to be inspected, outputs light directly upward, and the coolant 180B is caused to flow through the coolant flow path constituted by the grooves 161A and 162A. At this time, the coolant 180A is caused to flow through the coolant flow path 123 so as to cool the LED module 130.

The light output from the LED module 130 heats a portion of the top plate 160 located below the electronic device to be inspected such that the temperature of the electronic device to be inspected becomes the set temperature for the inspection. As a result, the electronic device to be inspected is heated. Further, since the electronic device itself generates heat when current flows through the electronic device, the LED module 130 is turned off and the coolant 180B is supplied to absorb heat, thereby lowering the temperature of the electronic device when the temperature of the electronic device becomes higher than the set temperature.

Further, when the temperature of the electronic device becomes lower than the set temperature, the LED module 130 may be turned on and the supply of the coolant 180B may be stopped so as to raise the temperature of the electronic device by heating. By performing the control of turning-on and turning-off of the LED module 130 and the control of the supply amount of the coolant 180B at high speed, the temperature of the electronic device to be inspected is adjusted to be within a predetermined temperature range with respect to the set temperature in the inspection (e.g., within ±3 degrees C.).

Here, simulation results and actual measurement results of load analysis are described. A load of 300 kg was applied by pressing the probes 24a against the electrode pads of a 30 mm square (30 mm long×30 mm wide in a plan view) electronic device in the central portion of a wafer W placed on the top plate 160.

As a result, in the simulation result for the stage 100, the central portion was displaced downward by 26 μm with respect to an edge (outer peripheral portion) of the top plate 160. In the actual measurement of the stage 100, the central portion was displaced downward by 32 μm with respect to the edge (outer peripheral portion) of the top plate 160. Thus, the value was close to the simulation result. It is considered that the glass plate 150 also underwent the same displacement as the top plate 160.

In the simulation result for a stage not including the transparent resin layer 140 for comparison, the central portion was displaced downward by 61.5 μm with respect to the edge (outer peripheral portion) of the top plate 160. In the actual measurement of the stage for comparison, the central portion was displaced downward by 83.5 μm with respect to the edge (outer peripheral portion) of the top plate 160. Thus, the value was close to the simulation result. It is considered that the glass plate 150 also underwent the same displacement as the top plate 160.

Thus, it was found that by providing the transparent resin layer 140, the displacement of the glass plate 150 and the top plate 160 can be significantly suppressed (½ or less).

As described above, according to the first embodiment, the glass plate 150 and the top plate 160 are supported and reinforced from the bottom by sealing the space between the LED module 130 and the glass plate 150 with the transparent resin layer 140. With this configuration, the stage 100 having a strength capable of withstanding a load during an inspection of electrical characteristics is implemented.

Accordingly, it is possible to provide the stage 100 that is capable of suppressing the displacement due to a load. Further, since the glass plate 150 and the top plate 160 can be prevented from being displaced by being reinforced by the transparent resin layer 140 and the inspection of electrical characteristics can be stably performed, an inspection having a high throughput is possible.

In the above description, the mode in which a wafer W having a plurality of electronic devices formed thereon is placed on the top plate 160 has been described. However, a plurality of electronic devices separated by dicing may be placed on the top plate 160 in a state of being arranged on a predetermined substrate.

In the above description, the mode in which the base portion 111 of the base plate 110, the base portion 121 of the middle plate 120, the base portion 151 of the glass plate 150, and the base portion 161 of the top plate 160 are disk-shaped has been described. However, the base portions 111, 121, 151, and 161 may be rectangular plate-shaped members in a plan view. In this case, the outer peripheral wall 122 of the middle plate 120 may be a rectangular wall in a plan view, and the transparent resin layer 140 may be rectangular in a plan view.

In addition, the configuration in which the top plate 160 has the grooves 161A and 162A on respective bottoms of the base portion 161 and the protrusion 162, and the coolant flow path is obtained by covering the glass plate 150 from the bottom has been described above.

However, the top plate 160 may have a coolant flow path provided inside the top plate 160 instead of the grooves 161A and 162A. This coolant flow path is located between the bottom surface and the placement surface 160A in the vertical direction (thickness direction) of the top plate 160.

Figure 5:
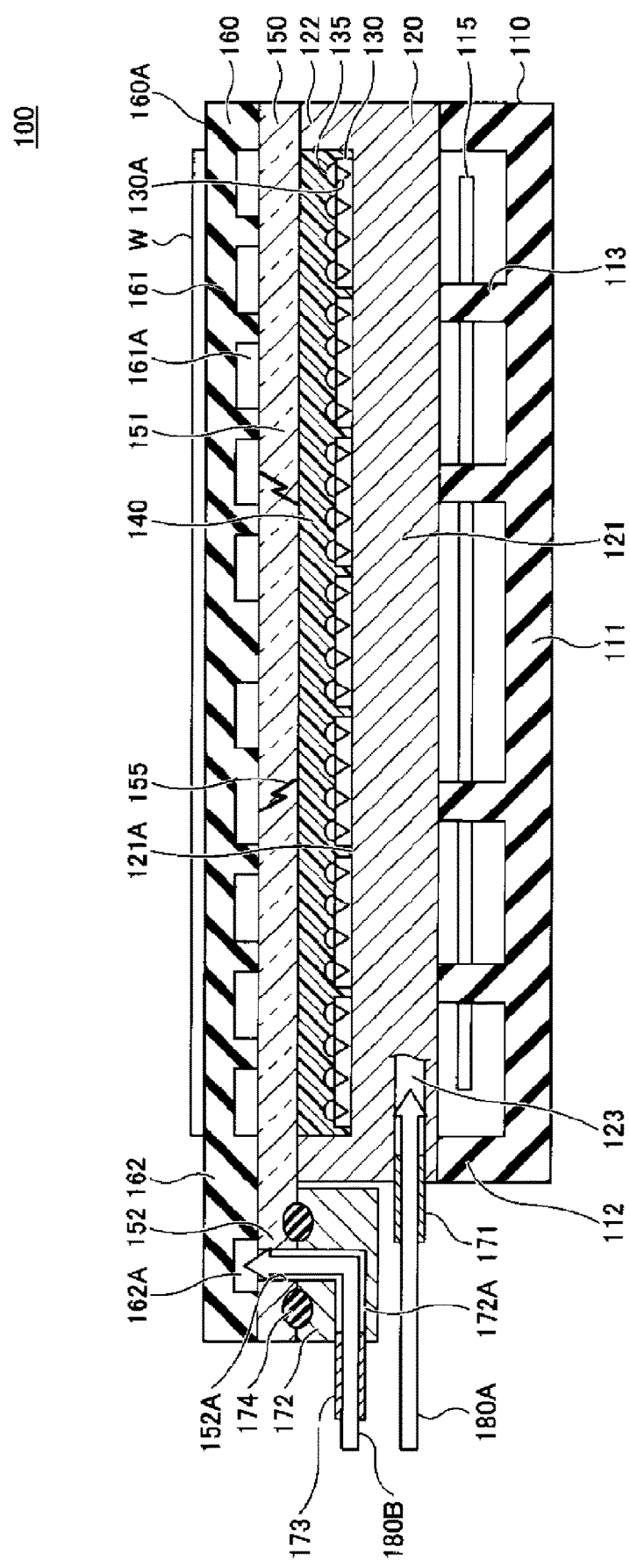
FIG. 5 is a view illustrating an exemplary state in which cracks are formed in a glass plate.

FIG. 5 is a view illustrating an exemplary state in which cracks 155 are formed in the glass plate 150. For example, it is assumed that the cracks 155 have been formed in the glass plate 150 by repeatedly inspecting electrical characteristics of the electronic devices on a wafer W and pressing the probes 24a (see FIG. 1) many times by applying a load to the electrode pads on the wafer W. It is assumed that the cracks 155 communicate with the coolant flow path formed by the groove 161A in the top plate 160.

Even if such a situation occurs, since the bottom surface of the glass plate 150 is in close contact with the transparent resin layer 140 and lower ends of the cracks 155 are closed by the transparent resin layer 140, it is possible to prevent the coolant 180B flowing in the coolant flow path formed by the groove 161A from flowing out of the coolant flow path through the cracks 155. As a result, it is possible to prevent the LED module 130 from being flooded.

Although the middle plate 120 has the through hole through which the wire connecting the control board 115 and the LED module 130 passes, even if the cracks 155 occur, it is possible to suppress infiltration of water below the top surface of the transparent resin layer 140. Thus, it is also possible to prevent the control board 115 from being flooded.

Figure 6:
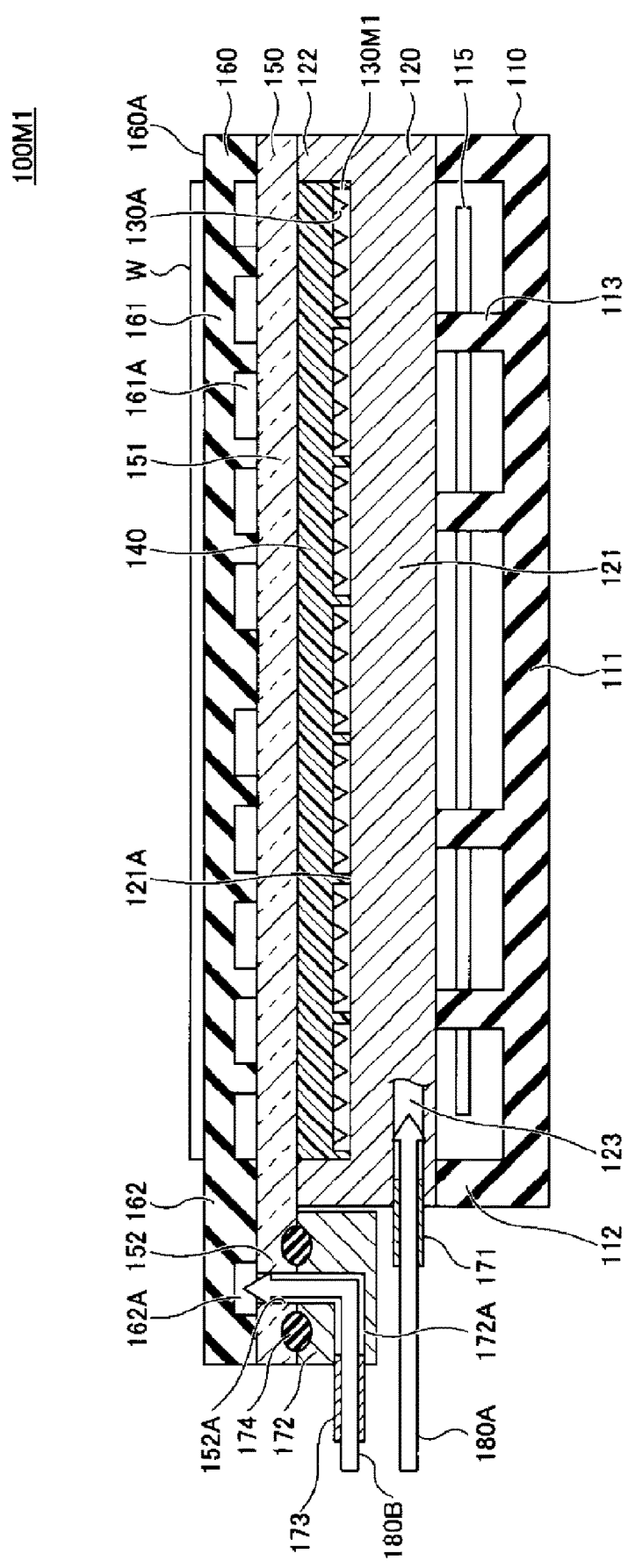
FIG. 6 is a cross-sectional view illustrating an exemplary configuration of a stage according to a first modification of the first embodiment.

FIG. 6 is a cross-sectional view illustrating an exemplary configuration of a stage 100M1 according to a first modification of the first embodiment. The stage 100M1 is obtained by replacing the LED module 130 of the stage 100 (see FIG. 4) of the first embodiment with an LED module 130M1.

The LED module 130M1 has LEDs 130A, but does not have the lenses 135 (see FIG. 4). Accordingly, in the stage 100M1, the LEDs 130A are directly covered with the transparent resin layer 140, and the light output from the LEDs 130A directly enters the transparent resin layer 140.

In the first modification of the first embodiment, as the LEDs 130A, LEDs having a small light dispersion and a good directivity (high straightness) may be used. In order to improve the efficiency of extracting light from the LEDs 130A, a material having a higher refractive index may be used as the resin material of the transparent resin layer 140. This is because the efficiency of extracting light from the LEDs 130A can be improved by using a resin material having a refractive index closer to that of the light emitting portions of the LEDs 130A.

According to the first modification of the first embodiment, it is possible to provide a stage 100M1 that is capable of suppressing the displacement thereof due to a load and reducing the costs for mounting the lenses 135 (see FIG. 4). The costs for mounting the lenses 135 include the cost for purchasing the lenses 135 and the cost for installing the lenses 135 on the LEDs 130A.

Figure 7:
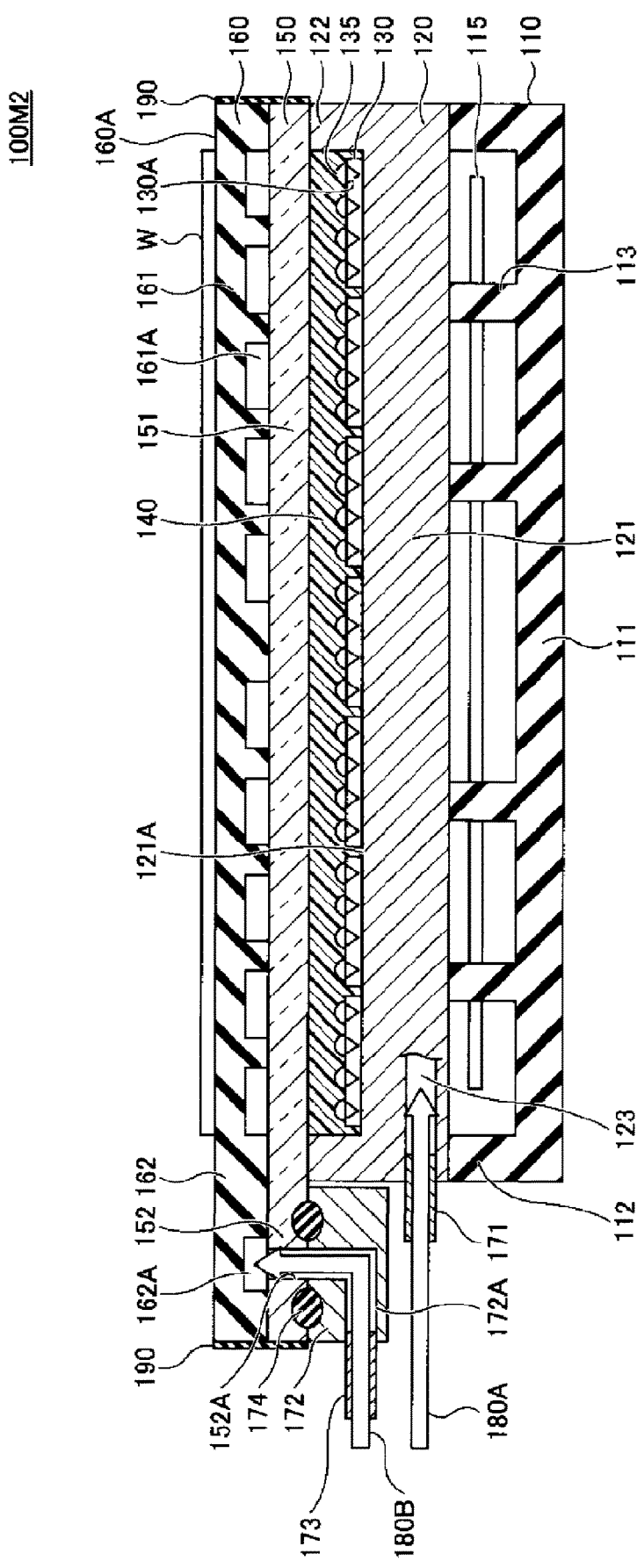
FIG. 7 is a cross-sectional view illustrating an exemplary configuration of a stage according to a second modification of the first embodiment.

FIG. 7 is a cross-sectional view illustrating an exemplary configuration of a stage 100M2 according to a second modification of the first embodiment. The stage 100M2 is obtained by attaching a reflective film 190 to the side surfaces of the glass plate 150 and the top plate 160 of the stage 100 of the first embodiment (see FIG. 4). More specifically, the reflective film 190 is provided on the outer peripheral surfaces of the base portions 151 and 161 of the glass plate 150 and the top plate 160 and the side surfaces of the protrusions 152 and 162.

The reflective film 190 is an example of a reflective part. The reflective film 190 is, for example, a silicon-based white coating agent applied to the outer peripheral surfaces of the base portions 151 and 161 of the glass plate 150 and the top plate 160 and the side surfaces of the protrusions 152 and 162. The outer peripheral surfaces of the base portions 151 and 161 of the glass plate 150 and the top plate 160 and the side surfaces of the protrusions 152 and 162 are examples of the side portions of the glass plate 150 and the top plate 160. The reflective film 190 preferably has water resistance.

The reflective film 190 is provided to increase the amount of light guided to the top plate 160 so as to improve the efficiency of heating the top plate 160 as well as to suppress the leakage of light to the outside of the glass plate 150 by reflecting scattered light or reflected light of the light transmitted through the inside of the glass plate 150 inward at the side surface.

For this reason, the reflective film is not limited to the silicon-based white coating material, and may be a tape or a frame-shaped member, and the color is not limited to white, and may be a silver color or other colors that reflect light. Further, the reflective film may be chrome-plated.

Figure 8:
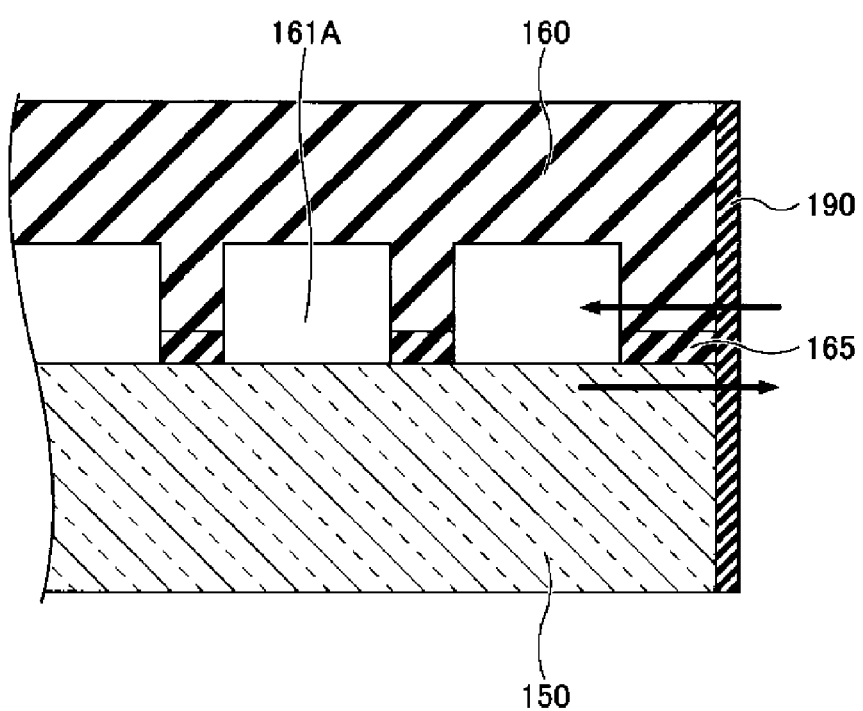
FIG. 8 is an enlarged view illustrating a portion of FIG. 7 by way of an example.

FIG. 8 is an enlarged view illustrating a portion of FIG. 7 by way of an example. FIG. 8 illustrates an adhesive layer 165 for bonding the glass plate 150 and the top plate 160 to each other. As an adhesive for forming the adhesive layer 165, for example, an epoxy-based adhesive may be used.

Since the glass plate 150 and the top plate 160 have different linear expansion coefficients, when heated, shear stress may be applied as indicated by arrows. If the adhesive layer 165 between the glass plate 150 and the top plate 160 is peeled off due to the shear stress, even if the coolant 180B does not leak from the coolant flow path formed by the grooves 161A, light may leak to the outside of the stage 100M2 from the interface of the adhesive layer 165 peeled off from the glass plate 150 or the top plate 160.

Even in such a case, the reflective film 190 is capable of reflecting the light to the inside of the glass plate 150, thereby suppressing light leakage. Thus, it is possible to improve heating efficiency by increasing the amount of light guided to the top plate 160.

In the second modification of the first embodiment, the mode in which the reflective film 190 is provided on the entire side surfaces of the glass plate 150 and the top plate 160 has been described. However, the reflective film 190 may not need to cover the entire side surface of the top plate 160 in the height direction, as long as the reflective film 190 covers at least the interface between the adhesive layer 165 and the top plate 160. This is because it is considered that the light output from the LED module 130 hardly passes through the top plate 160.

The reflective film 190 may be provided only on the side surface of the glass plate 150 when there is almost no risk of peeling of the adhesive layer 165. In such a case, it is sufficient to suppress light leakage from the side surface of the glass plate 150.

Figure 9:
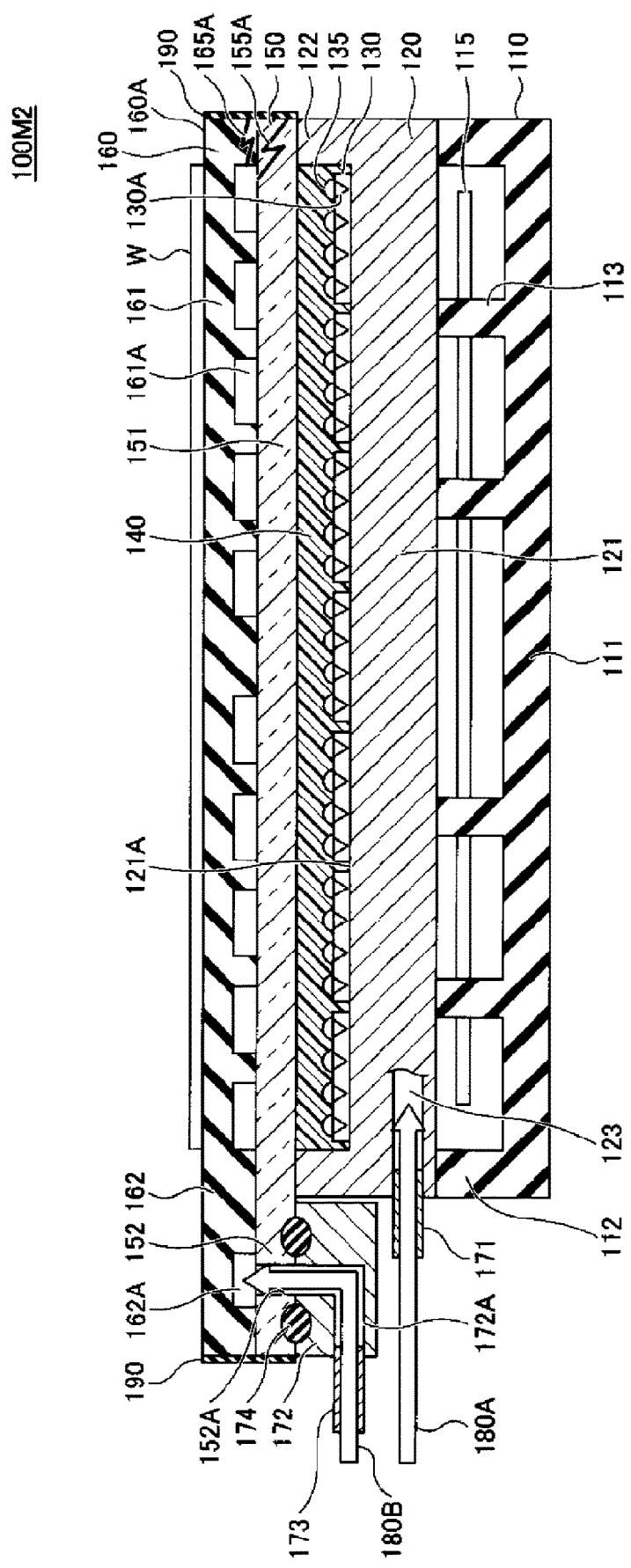
FIG. 9 is a view illustrating an exemplary state in which cracks are generated in the glass plate and the top plate, respectively, in the stage of the second modification of the first embodiment.

FIG. 9 is a view illustrating an exemplary state in which cracks 155A and 165A are included in the glass plate 150 and the top plate 160, respectively, in the stage 100M2 of the second modification of the first embodiment. It is assumed that the cracks 155A and 165A are in communication with the coolant flow path formed by the grooves 161A in the top plate 160, in an inward direction of the stage 100M2, and reach the side surfaces of the glass plate 150 and the top plate 160, in an outward direction of the stage 100M2.

Even if such a situation occurs, since the side surfaces of the glass plate 150 and the top plate 160 in which the cracks 155A and 165A have been formed are covered with the water-resistant reflective film 190, it is possible to prevent the coolant 180B flowing in the coolant flow path formed by the grooves 161A from flowing out of the coolant flow path through the cracks 155A and 165A.

"Water resistance" means that even if the reflective film comes into contact with water or Galden as the coolant 180B through the cracks 155A and 165A, the reflective film does not absorb the water or Galden or is not deformed. From this point of view, as the reflective film 190, a highly water-resistant film may be used.

As described above, according to the second modification of the first embodiment, it is possible to provide the stage 100M2 that is capable of increasing the amount of light guided to the top plate 160 so as to improve the heat efficiency as well as suppressing the leakage of light to the outside of the glass plate 150, in addition to being able to suppress the displacement due to a load, by attaching the reflective film 190.

For example, when there is a person around the stage 100M2, it is very effective to suppress the leakage of light to the outside of the glass plate 150.

According to the second modification of the first embodiment, it is possible to provide the stage 100M2 that is capable of suppressing the leakage of the coolant 180B by the water-resistant reflective film 190 even if the cracks 155A and 165A are formed in the glass plate 150 and the top plate 160, respectively.

Figure 10:
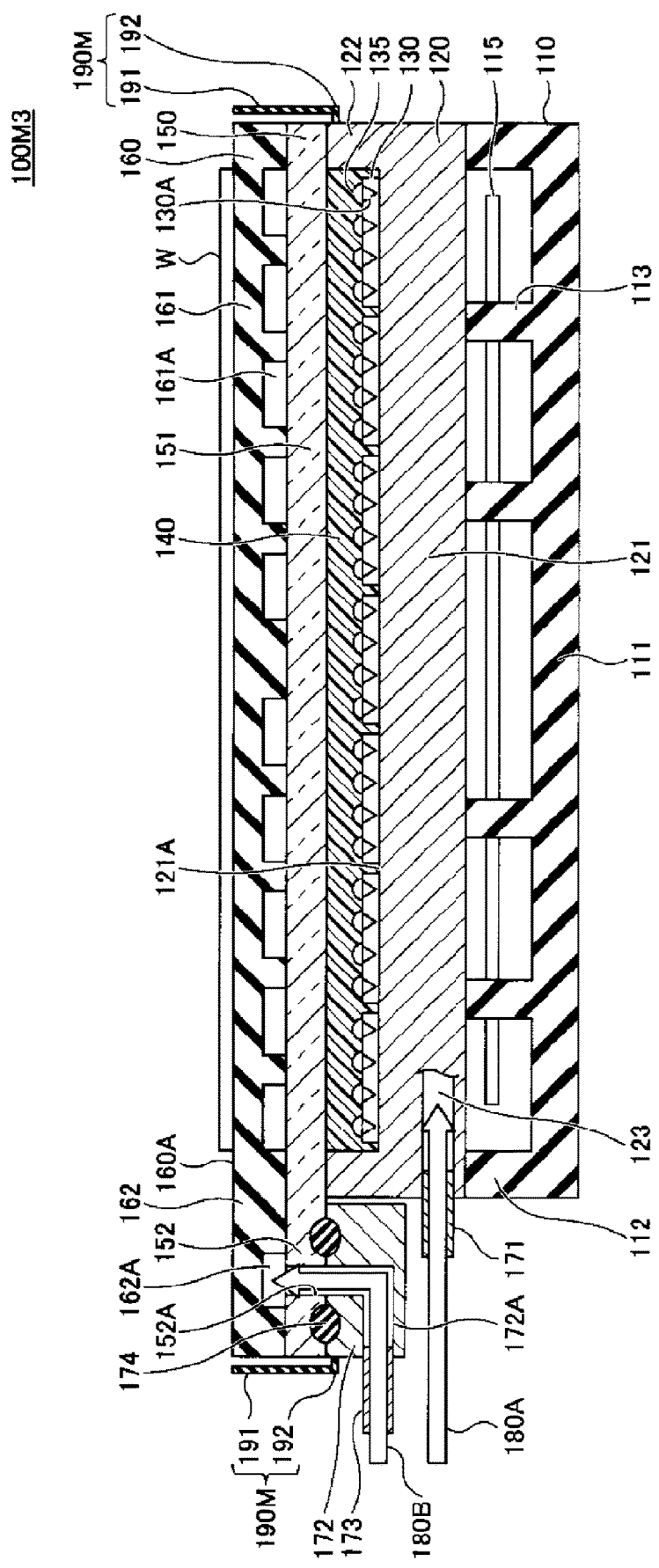
FIG. 10 is a cross-sectional view illustrating an exemplary configuration of a stage according to a third modification of the first embodiment.

FIG. 10 is a cross-sectional view illustrating an exemplary configuration of a stage 100M3 according to a third modification of the first embodiment. The stage 100M3 is obtained by replacing the reflective film 190 of the stage 100M2 (see FIG. 7) of the second modification of the first embodiment with a reflective member 190M.

The reflective member 190M is an example of a reflective part and has a reflective plate 191 and a stay 192. The reflective plate 191 is provided along the side surfaces of the glass plate 150 and the top plate 160 to be spaced apart from the side surfaces. The positions separated from the side surfaces of the glass plate 150 and the top plate 160 are examples of the side portions of the glass plate 150 and the top plate 160.

The reflective plate 191 is, for example, a frame-shaped member having the same shape as the glass plate 150 and the top plate 160 in a plan view, and is made of, for example, metal or resin. For example, when the reflective plate 191 is made of metal, the metal surface facing the glass plate 150 and the top plate 160 may be used as the reflective plate. Further, in the case where the reflective plate 191 is made of resin, the surface facing the glass plate 150 and the top plate 160 may be coated with, for example, a silicon-based white coating agent.

A plurality of stays 192 are provided on the side surfaces of the glass plate 150 and the top plate 160, and one end of each stay 192 (the end located inside the stage 100M3 in a plan view) is fixed to the outer peripheral surface of the outer peripheral wall 122 of the middle plate 120 and the outer surface of the connecting portion 172 by, for example, screwing. The stay 192 is a rod-shaped member made of metal or resin, and the other end (the end located outside the stage 100M3 in a plan view) is fixed to the reflective plate 191 by, for example, screwing.

Since the reflective member 190M functions similarly to the reflective film 190 (see FIG. 7), according to the third modification of the first embodiment, it is possible to provide a stage 100M3 having the following effects. That is, in addition to being able to suppress the displacement due to a load, by attaching the reflective film 190M, it is possible to provide a stage 100M3 that is capable of increasing the amount of light guided to the top plate 160 so as to improve the heat efficiency as well as suppressing the leakage of light to the outside of the glass plate 150.

Figure 11:
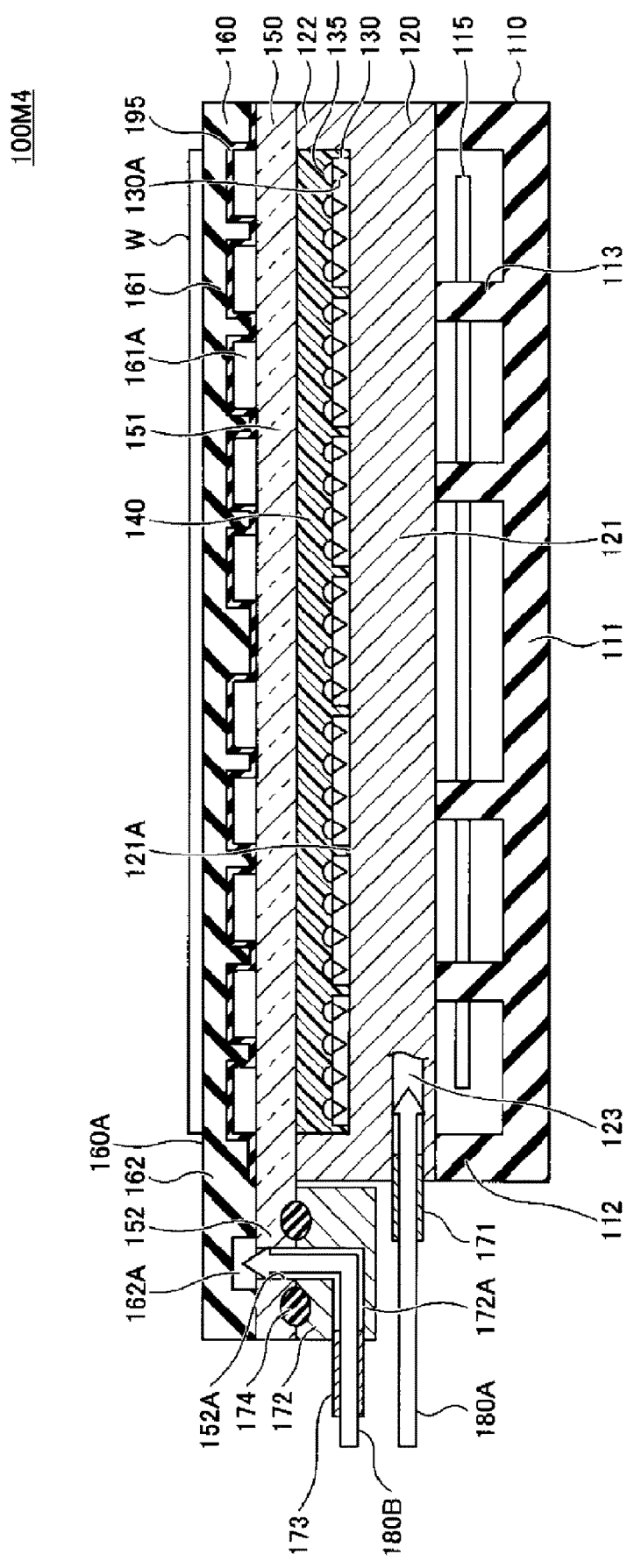
FIG. 11 is a cross-sectional view illustrating an exemplary configuration of a stage according to a fourth modification of the first embodiment.

FIG. 11 is a cross-sectional view illustrating an exemplary configuration of a stage 100M4 according to a fourth modification of the first embodiment. The stage 100M4 is obtained by applying a black coating 195 to the bottom surface of the top plate 160 of the stage 100 (see FIG. 4) of the first embodiment.

The black coating 195 is an example of a heat absorption film, and is applied to the inside of the grooves 161A in the base portion 161 of the top plate 160 and the portion in contact with the glass plate 150. The black coating 195 is provided in order to more efficiently absorb the light output from the LED module 130 and transmitted through the transparent resin layer 140 and the glass plate 150 at the bottom surface of the top plate 160, and to more efficiently heat the top plate 160. By applying such black coating 195, it is possible to more efficiently heat the electronic devices on the wafer W.

As the black coating 195, a water-based paint or a fluororesin coating containing black ceramic powder having water resistance and heat resistance may be applied. The top plate 160 having the black coating 195 applied thereto may be bonded onto the glass plate 150.

As described above, according to the fourth modification of the first embodiment, it is possible to provide the stage 100M4 that is capable of more efficiently absorbing light in the top plate so as to improve heating efficiency by applying the black coating 195 to the bottom surface of the top plate 160, in addition to being able to suppress the displacement due to a load.

In the fourth modification of the first embodiment, the mode in which the black coating 195 as an example of the heat absorption film is applied to the bottom surface of the top plate 160 has been described. However, the film is not limited to the black coating 195 as long as the film is capable of increasing the heat absorption amount of the top plate 160. The color may be other than black (e.g., dark gray), and the material of the heat absorption film may be other than those described above.

Second Embodiment

Figure 12:
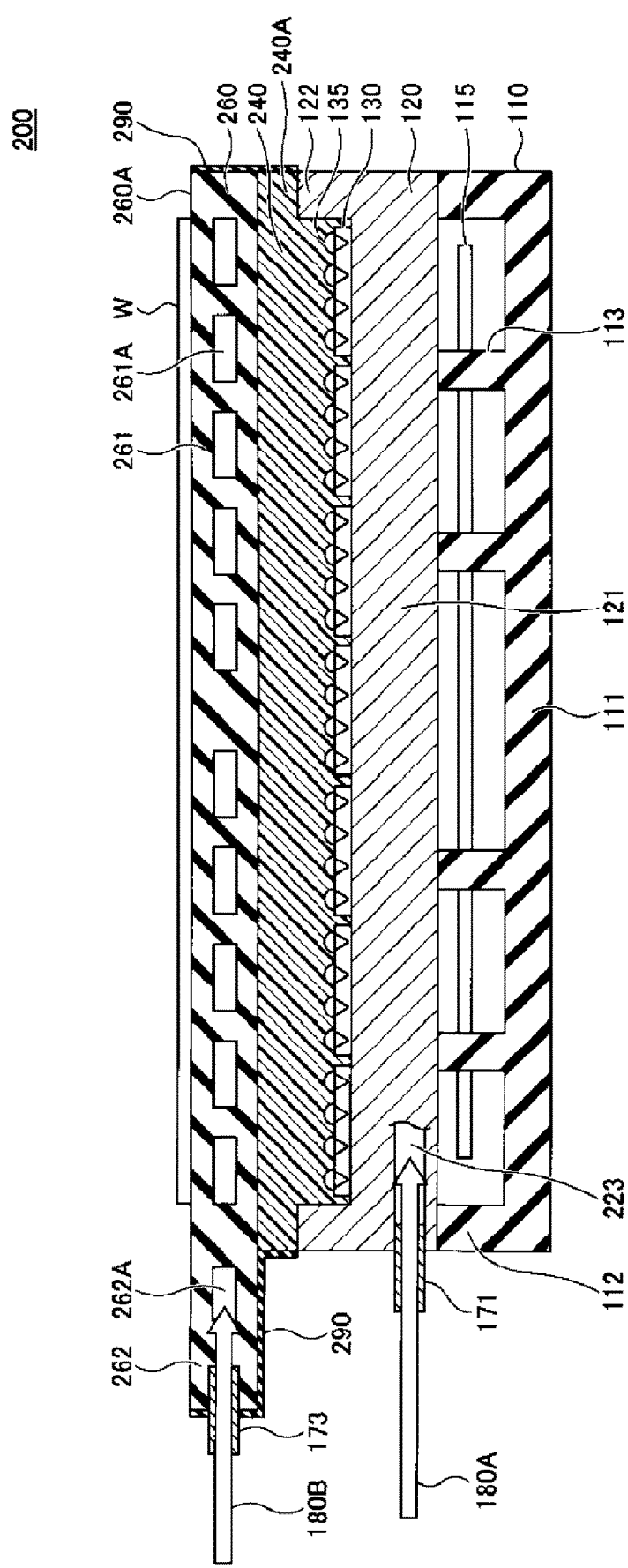
FIG. 12 is a cross-sectional view illustrating an exemplary configuration of a stage according to a second embodiment.

FIG. 12 is a cross-sectional view illustrating an exemplary configuration of a stage 200 according to a second embodiment. The stage 200 includes a base plate 110, a control board 115, a middle plate 120, an LED module 130, a transparent resin layer 240, a top plate 260, a pipe 171, a pipe 173, and a reflective film 290. The stage 200 differs from the stage 100 of the first embodiment in that the stage 200 does not include the glass plate 150 (see FIG. 4) but includes the reflective film 290. Hereinafter, a description will be made with reference to a vertical direction in the drawing. Further, the term "in a plan view" means "viewed from above to below in a plane."

The transparent resin layer 240 has a configuration in which the transparent resin layer 140 (see FIG. 4) of the stage 100 of the first embodiment is enlarged in the upward direction to expand to a portion where the glass plate 150 was present. The outer peripheral portion 240A of the transparent resin layer 240, which is enlarged upward compared to the transparent resin layer 140, is located on the outer peripheral wall 122 of the middle plate 120. The transparent resin layer 240 supports and reinforces the top plate 260 from the bottom thereof.

The transparent resin layer 240 that is in close contact with the bottom surface of the top plate 260 is obtained by filling the inside of the middle plate 120 and a mold with the resin material of the transparent resin layer 240, for example, in a state in which the mold is provided on the outer peripheral surface of the outer peripheral wall 122 of the middle plate 120, and fixing the top plate 260 to the mold before the resin material is cured.

The top plate 260 is arranged on the top surface of the transparent resin layer 240, and includes a placement surface 260A on which the wafer W is placed, a disk-shaped base portion 261, and a protrusion 262 protruding from the base portion 261 in a plan view. The top plate 260 is an example of a second cooling plate. As the top plate 260, for example, a silicon carbide (SiC) plate may be used. The top plate 260 includes a vacuum chuck or an electrostatic chuck (not illustrated).

The top plate 260 has a coolant flow path 261A inside the base portion 261 and a coolant flow path 262A inside the protrusion 262. The coolant flow paths 261A and 262A are an example of a second coolant flow path.

The coolant flow path 261A is formed in a predetermined pattern (e.g., a spiral pattern) in the entire base portion 261 in a plan view, and a plurality of flow paths 261A, the cross sections of which are illustrated in FIG. 12, all communicate with each other and communicate with the coolant flow path 262A provided in the protrusion 262.

Therefore, the coolant 180B flowing from the pipe 173 into the coolant flow path 262A as indicated by an arrow flows into the coolant flow path 261A, passes through a discharge groove (not shown) similar to that in the coolant flow path 262A, and is discharged to the outside of the stage 100.

The reflective film 290 is provided on an outer peripheral surface of an outer peripheral portion 240A of the transparent resin layer 240, the outer peripheral surface of the base portion 261 of the top plate 260, and a side surface and a bottom surface of the protrusion 262 of the top plate 260. The reflective film 290 is formed by applying, for example, a silicon-based white coating agent, similarly to the reflective film 190 of the second modification of the first embodiment. The reflective film 290 may not be provided on the side surface and the bottom surface of the protrusion 262 of the top plate 260.

As described above, according to the second embodiment, the top plate 260 is supported and reinforced from the bottom thereof by sealing the space between the LED module 130 and the top plate 260 with the transparent resin layer 240. With this configuration, the top plate 260 is hardly displaced even when a load is applied from above, and thus the stage 200 having a strength that is capable of withstanding the load during the inspection of electrical characteristics is implemented.

Accordingly, it is possible to provide the stage 200 that is capable of suppressing the displacement due to a load.

In the second embodiment, the mode in which the top plate 260 has coolant flow paths 261A and 262A has been described. However, the top plate 260 may have a configuration in which the top plate 260 has grooves formed on the bottom thereof like the grooves 161A and 162A of the first embodiment (see FIG. 4) and coolant flow paths are obtained by closing the grooves by a transparent layer 240 from the bottom of the top plate 260.

The stage 200 of the second embodiment may have a configuration that does not have the lenses 135, may have a configuration that includes a reflective member 190M (see FIG. 10) instead of the reflective film 290, or may have a configuration in which a black coating 195 (see FIG. 11) is applied to the bottom surface of the top plate 260.

Figure 13:
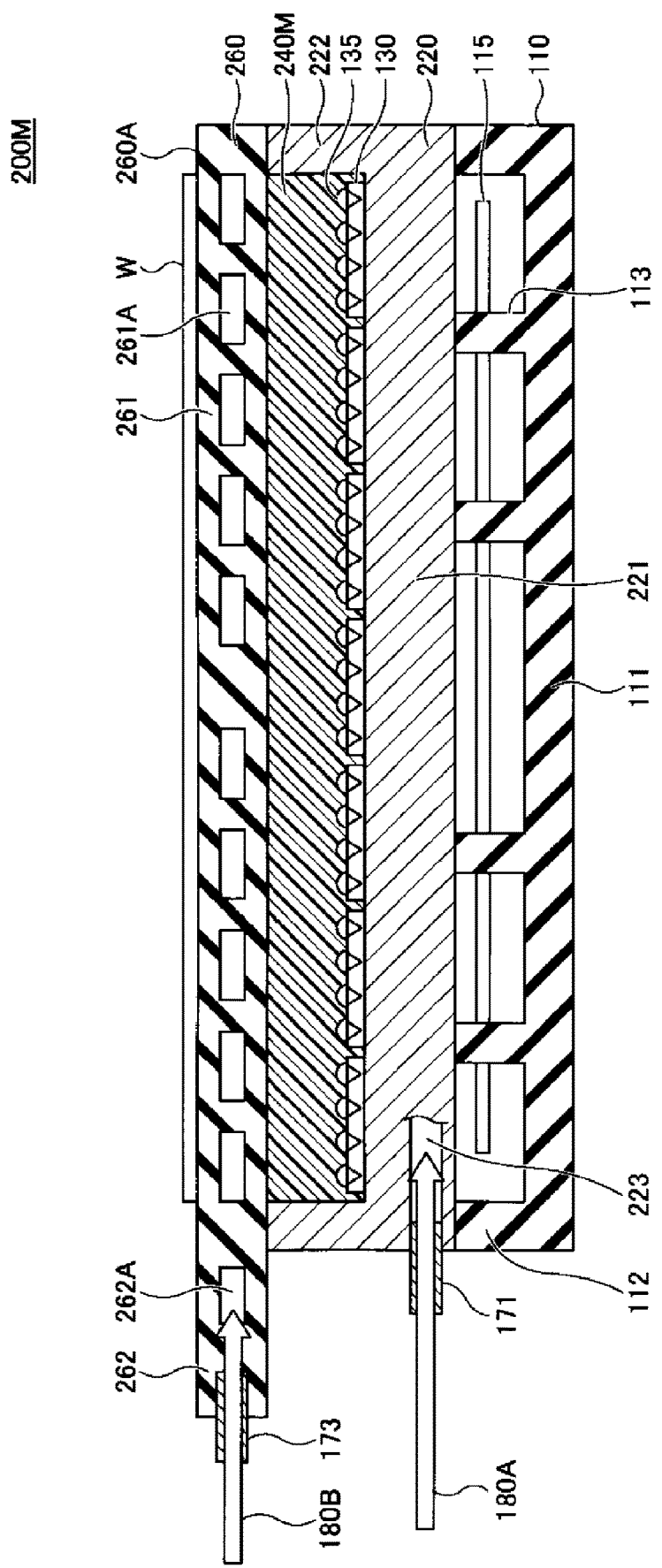
FIG. 13 is a cross-sectional view illustrating an exemplary configuration of a stage according to a modification of the second embodiment.

FIG. 13 is a cross-sectional view illustrating an exemplary configuration of a stage 200M according to a modification of the second embodiment. The stage 200M includes a base plate 110, a control board 115, a middle plate 220, an LED module 130, a transparent resin layer 240M, a top plate 260, a pipe 171, and a pipe 173. The stage 200M has a configuration in which the middle plate 120 and the transparent resin layer 240 of the stage 200 of the second embodiment are replaced with the middle plate 220 and the transparent resin layer 240M, and the reflective film 290 is removed.

The middle plate 220 has a base portion 221, an outer peripheral wall 222, and a coolant flow path 223. The middle plate 220 has a configuration in which the outer peripheral wall 122 of the middle plate 120 (see FIG. 4) of the stage 100 of the first embodiment is raised to the glass plate 150 (see FIG. 4). The configurations of the base portion 221 and the coolant flow path 223 are similar to those of the base portion 121 and the coolant flow path 123 of the middle plate 120 (see FIG. 4) of the stage 100 of the first embodiment.

An upper end of the outer peripheral wall 222 of the middle plate 220 is bonded to the bottom surface of the top plate 260 in a state in which the space surrounded by the base portion 221 and the outer peripheral wall 222 is filled with the transparent resin layer 240M.

The transparent resin layer 240M fills the space surrounded by the base portion 221 and the outer peripheral wall 222 of the middle plate 220 and the top plate 260, and covers the LED module 130. The transparent resin layer 240M supports and reinforces the top plate 260 from the bottom of the top plate 260.

As described above, according to the modification of the second embodiment, the top plate 260 is supported and reinforced from its bottom by sealing the space between the LED module 130 and the top plate 260 with the transparent resin layer 240M. With this configuration, the top plate 260 is hardly displaced even when a load is applied from above, and thus the stage 200M having a strength that is capable of withstanding the load during the inspection of electrical characteristics is implemented.

Accordingly, it is possible to provide the stage 200M that is capable of suppressing the displacement due to a load.

The stage 200M of the second embodiment may have a configuration that does not have the lenses 135, may have a configuration that includes a reflective film 190 (see FIG. 7) or a reflective member 190M (see FIG. 10), or may have a configuration in which the black coating 195 (see FIG. 11) is applied to the bottom surface of the top plate 260.

According to an aspect, it is possible to suppress the displacement of the stage on which an inspection object is placed due to a load.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A stage on which an inspection object having an electronic device against which a contact terminal of a probe card of an inspection apparatus is pressed by a load applied thereto is placed, the stage comprising:
    a first cooling plate including a first coolant flow path formed therein;
    a heating source mounted on the first cooling plate and including a plurality of light emitting elements so as to heat the inspection object;
    a transparent member provided on the heating source and transmitting light output from the heating source;
    a second cooling plate provided on the transparent member so as to hold the inspection object and including a second coolant flow path formed therein; and
    a transparent resin layer filled between the first cooling plate and the transparent member so as to cover the heating source and to seal a space between the heating source and the transparent member.

2. The stage of claim 1, further comprising:
    a reflective part provided on a side portion of the transparent member and configured to reflect light output from the heating source to an inside of the transparent member.

3. The stage of claim 1, wherein the second coolant flow path is formed in a bottom surface of the second cooling plate or inside the second cooling plate.

4. The stage of claim 1, further comprising:
    a heat absorption film provided on a bottom surface of the second cooling plate.

5. The stage of claim 1, wherein each of the light emitting elements includes a lens provided on a light emitting part.

6. A stage on which an inspection object having an electronic device against which a contact terminal of a probe card of an inspection apparatus is pressed by a load applied thereto is placed, the stage comprising:
- a first cooling plate including a first coolant flow path formed therein;
- a heating source mounted on the first cooling plate and including a plurality of light emitting elements so as to heat the inspection object;
- a second cooling plate provided on the first cooling plate so as to hold the inspection object and including a second coolant flow path formed therein; and
- a transparent resin layer filled between the first cooling plate and the second cooling plate to cover the heating source and to seal a space between the heating source and the second cooling plate, and configured to transmit light output from the heating source.

7. The stage of claim 6, further comprising:
- a reflective part provided on a side portion of the transparent resin layer and configured to reflect light output from the heating source to an inside of the transparent resin layer.

8. The stage of claim 7, wherein the reflective part extends to a side portion of the second cooling plate.

9. The stage of claim 6, wherein the second coolant flow path is formed in a bottom surface of the second cooling plate or inside the second cooling plate.

10. The stage of claim 6, further comprising:
- a heat absorption film provided on a bottom surface of the second cooling plate.

11. The stage of claim 6, wherein each of the light emitting elements includes a lens provided on a light emitting part.

12. An inspection apparatus that presses a contact terminal of a probe card against an inspection object so as to inspect an electronic device on the inspection object, the inspection apparatus comprising:
- a stage on which the inspection object is placed;

wherein the stage includes:
- a first cooling plate including a first coolant flow path formed therein;
- a heating source mounted on the first cooling plate and including a plurality of light emitting elements so as to heat the inspection object;
- a transparent member provided on the heating source and transmitting light output from the heating source;
- a second cooling plate provided on the transparent member so as to hold the inspection object and including a second coolant flow path formed therein; and
- a transparent resin layer filled between the first cooling plate and the transparent member so as to cover the heating source and to seal a space between the heating source and the transparent member.

13. An inspection apparatus that presses a contact terminal of a probe card against an inspection object so as to inspect an electronic device on the inspection object, the inspection apparatus comprising:
- a stage on which the inspection object is placed;

wherein the stage comprises:
- a first cooling plate including a first coolant flow path formed therein;
- a heating source mounted on the first cooling plate and including a plurality of light emitting elements so as to heat the inspection object;
- a second cooling plate provided on the first cooling plate so as to hold the inspection object and including a second coolant flow path formed therein; and
- a transparent resin layer filled between the first cooling plate and the second cooling plate to cover the heating source and to seal a space between the heating source and the second cooling plate, and configured to transmit light output from the heating source.

* * * * *